(12) United States Patent
Hamada et al.

(10) Patent No.: US 12,310,242 B2
(45) Date of Patent: May 20, 2025

(54) PIEZOELECTRIC ELEMENT AND LIQUID EJECTION HEAD

(71) Applicant: SEIKO EPSON CORPORATION, Tokyo (JP)

(72) Inventors: Yasuaki Hamada, Nagano (JP); Tomohiro Sakai, Nagano (JP); Toshihiro Shimizu, Fujimi-machi (JP); Masao Nakayama, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 219 days.

(21) Appl. No.: 18/069,273

(22) Filed: Dec. 21, 2022

(65) Prior Publication Data

US 2023/0210011 A1 Jun. 29, 2023

(30) Foreign Application Priority Data

Dec. 23, 2021 (JP) ................. 2021-209177

(51) Int. Cl.
*H10N 30/00* (2023.01)
*B41J 2/14* (2006.01)
*H10N 30/20* (2023.01)
*H10N 30/853* (2023.01)

(52) U.S. Cl.
CPC ........ *H10N 30/708* (2024.05); *B41J 2/14201* (2013.01); *H10N 30/2047* (2023.02); *H10N 30/8542* (2023.02); *B41J 2002/14306* (2013.01)

(58) Field of Classification Search
CPC ..... B41J 2/14; B41J 2/045; B41J 2/055; B41J 2/135; B41J 2/145; B41J 2002/14346; B41J 2002/14241; B41J 2002/14491; B41J 2/14233; B41J 2/161; B41J 2/14201; B41J 2202/03; H10N 30/00; H10N 30/8542; H10N 30/704; B06B 1/0644; H01L 2924/12036
See application file for complete search history.

(56) References Cited

U.S. PATENT DOCUMENTS

| | | | |
|---|---|---|---|
| 2005/0029629 A1* | 2/2005 | Noguchi | H03H 3/02 438/584 |
| 2011/0273517 A1* | 11/2011 | Miyazawa | B41J 2/1646 347/68 |
| 2012/0170163 A1* | 7/2012 | Mikolajczak | H01L 24/84 361/57 |
| 2014/0145555 A1 | 5/2014 | Kurachi et al. | |
| 2021/0408361 A1* | 12/2021 | Hamada | H10N 30/2047 |

FOREIGN PATENT DOCUMENTS

JP 2014-112675 A 6/2014

\* cited by examiner

*Primary Examiner* — John Zimmermann
(74) *Attorney, Agent, or Firm* — Global IP Counselors, LLP

(57) ABSTRACT

A piezoelectric element includes: a first electrode; an oxide layer formed on the first electrode; a piezoelectric layer formed on the oxide layer and containing potassium, sodium, and niobium; and a second electrode formed on the piezoelectric layer. When a potential difference of 10 V is applied between the first electrode and the second electrode, a current density of a leak current differs by 10,000 times or more between a case in which the first electrode is set at a high potential and a case in which the second electrode is set at a high potential.

8 Claims, 5 Drawing Sheets

PIEZOELECTRIC ELEMENT AND LIQUID EJECTION HEAD

The present application is based on, and claims priority from JP Application Serial Number 2021-209177, filed Dec. 23, 2021, the disclosure of which is hereby incorporated by reference herein in its entirety.

BACKGROUND

1. Technical Field

The present disclosure relates to a piezoelectric element and a liquid ejection head.

2. Related Art

A piezoelectric element is used in various fields such as a liquid ejection head of an inkjet printer and a sensor. As a piezoelectric material, for example, potassium sodium niobate or lead zirconate titanate is used. The piezoelectric element is operated by disposing a piezoelectric material between a pair of electrodes and applying an electric field to the piezoelectric material by the electrodes. In such a piezoelectric element, a leak current that does not contribute to an operation may be generated.

For example, in JP-A-2014-112675, a part of elements of a piezoelectric material is replaced in order to reduce a leak current of the piezoelectric element.

However, although a leak current tends to be reduced by substituting elements of the piezoelectric material, dielectric breakdown is likely to occur, which may cause damage to piezoelectric characteristics. Therefore, a piezoelectric element in which a leak current is prevented while maintaining good piezoelectric characteristics is required.

SUMMARY

A piezoelectric element according to an aspect of the present disclosure includes: a first electrode; an oxide layer formed on the first electrode; a piezoelectric layer formed on the oxide layer and containing potassium, sodium, and niobium; and a second electrode formed on the piezoelectric layer, and when a potential difference of 10 V is applied between the first electrode and the second electrode, a current density of a leak current differs by 10,000 times or more between a case in which the first electrode is set at a high potential and a case in which the second electrode is set at a high potential.

A liquid ejection head according to an aspect of the present disclosure includes: the above piezoelectric element; a flow path formation substrate provided with a pressure generation chamber whose capacity is changed by the piezoelectric element; and a nozzle plate provided with a nozzle hole that is in communication with the pressure generation chamber.

DESCRIPTION OF EXEMPLARY EMBODIMENTS

Hereinafter, embodiments of the present disclosure will be described. The embodiment to be described later is used for describing examples of the present disclosure. The present disclosure is not limited to the following embodiments at all, and includes various modifications implemented without departing from the gist of the present disclosure. Not all configurations to be described below are necessarily essential configurations of the present disclosure.

1. Piezoelectric Element

A piezoelectric element according to the present embodiment includes a first electrode, an oxide layer formed on the first electrode, a piezoelectric layer formed on the oxide layer and containing potassium, sodium, and niobium, a second electrode formed on the piezoelectric layer.

1.1. Configuration

Figure 1:
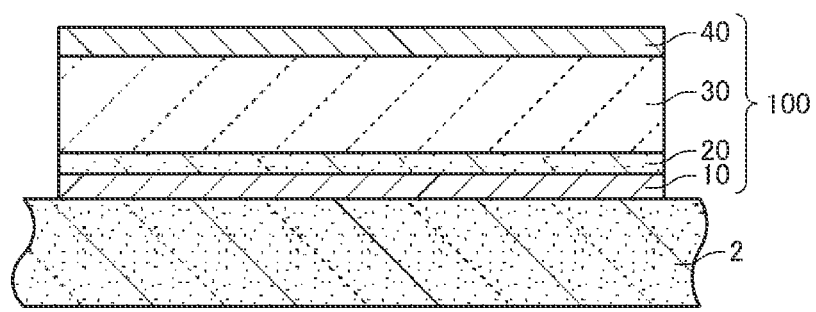
FIG. 1 is a cross-sectional view schematically showing a piezoelectric element according to the present embodiment.

First, the piezoelectric element according to the present embodiment will be described with reference to the drawings. FIG. 1 is a cross-sectional view schematically showing a piezoelectric element 100 according to the present embodiment.

The piezoelectric element 100 includes a first electrode 10, an oxide layer 20, a piezoelectric layer 30, and a second electrode 40, as shown in FIG. 1. The piezoelectric element 100 is provided on a base 2.

The base 2 is, for example, a flat plate made of a semiconductor, an insulator, and the like. The base 2 may be a single layer or a stack body in which a plurality of layers are stacked. An internal structure of the base 2 is not limited as long as an upper surface thereof has a planar shape, and the base 2 may have a structure in which a space or the like is formed therein. The base 2 can be, for example, a silicon substrate. In this case, the silicon substrate is more preferably a silicon substrate preferentially oriented in a plane (100). In this way, a piezoelectric element can be more suitably used as a configuration of a liquid ejection head with a small leak current and high efficiency.

The base 2 may include a vibrating plate that is flexible and that deforms when the piezoelectric layer 30 is operated. The vibrating plate is, for example, a silicon oxide layer, a zirconium oxide layer, or a stack body in which a zirconium oxide layer is provided on a silicon oxide layer.

The first electrode 10 is provided on the base 2. The first electrode 10 is provided between the base 2 and the oxide layer 20. A shape of the first electrode 10 is, for example, layered. A thickness of the first electrode 10 is, for example, 3 nm or more and 300 nm or less. The first electrode 10 is, for example, a metal layer such as a platinum layer, an iridium layer, a titanium layer, and a ruthenium layer, and may be a conductive oxide layer thereof or the like as long as sufficient conductivity is obtained. The first electrode 10 may have a structure in which a plurality of layers exemplified above are stacked.

The first electrode 10 is one electrode for applying a voltage to the piezoelectric layer 30. The first electrode 10 is a lower electrode provided below the piezoelectric layer 30.

The oxide layer 20 is provided on the first electrode 10. The oxide layer 20 is provided between the first electrode 10 and the piezoelectric layer 30. Although not shown, the oxide layer 20 may be provided on at least one of the first electrode 10 and the base 2. A thickness of the oxide layer 20 is, for example, 5 nm or more and 50 nm or less, preferably 10 nm or more and 40 nm or less, and more preferably 20 nm or more and 30 nm or less. The oxide layer 20 forms a pn junction at a boundary with the piezoelectric layer 30, as will be described later. Therefore, unlike a conductive oxide layer provided as a candidate for the first electrode 10, the oxide layer 20 is preferably crystallized, and more preferably aligned vertically with respect to a surface of the first electrode 10.

A material of the oxide layer 20 is not particularly limited as long as being a material capable of forming a pn junction with respect to a material of the piezoelectric layer 30, and examples thereof include an oxide containing strontium and ruthenium, an oxide containing lanthanum and nickel, and an oxide containing strontium and titanium. These oxides may be doped with additives as required. Examples of the additive include niobium and lanthanum, which can be appropriately selected in consideration of a valence or the like in order to form a pn junction. When the additives are doped, the doping may be performed in the same manner as in semiconductor manufacturing or may be performed by blending a raw material to be formed.

The material of the oxide layer 20 more preferably contains strontium and ruthenium. In this way, the pn junction can be formed without doping. Even if the material contains strontium and ruthenium, electrical properties can also be adjusted by doping or the like.

The piezoelectric layer 30 is provided on the oxide layer 20. The piezoelectric layer 30 is provided between the oxide layer 20 and the second electrode 40. Although not shown, the piezoelectric layer 30 may be provided on the first electrode 10, the oxide layer 20 and/or the base 2. A thickness of the piezoelectric layer 30 is, for example, 100 nm or more and 3 μm or less. The piezoelectric layer 30 can be deformed by applying a voltage between the first electrode 10 and the second electrode 40.

The piezoelectric layer 30 has a perovskite structure. The piezoelectric layer 30 contains potassium (K), sodium (Na), and niobium (Nb). In the present specification, a material containing potassium (K), sodium (Na), and niobium (Nb) may be referred to as KNN. In the piezoelectric layer 30, a ratio $D_A/D_B$ of an atomic concentration $D_A$ at a site A to an atomic concentration $D_B$ at a site B of the perovskite structure is, for example, 1.01 or more and 1.10 or less, preferably 1.02 or more and 1.06 or less. When the piezoelectric layer 30 is KNN, in the piezoelectric layer 30, a total of the number of potassium atoms and the number of sodium atoms is more than the number of niobium atoms by, for example, 1% or more and 10% or less, preferably 2% or more and 6% or less.

The second electrode 40 is provided on the piezoelectric layer 30. Although not shown, the second electrode 40 may be provided on a side surface of the piezoelectric layer 30 and the base 2 as long as the second electrode is electrically separated from the first electrode 10.

A shape of the second electrode 40 is, for example, layered. A thickness of the second electrode 40 is, for example, 3 nm or more and 300 nm or less. The second electrode 40 is, for example, a metal layer such as an iridium layer, a platinum layer, a titanium layer, and a ruthenium layer, a conductive oxide layer thereof, a lanthanum nickelate layer, and a strontium ruthenate layer. The second electrode 40 may have a structure in which the plurality of layers exemplified above are stacked.

The second electrode 40 is the other electrode for applying a voltage to the piezoelectric layer 30. The second electrode 40 is an upper electrode provided on the piezoelectric layer 30.

1.2. Regarding Leak Current

In development of a KNN thin film intended to reduce a leak current, it is common to reduce lattice defects in crystals of a composite oxide of a piezoelectric layer to reduce carriers as much as possible, and in the KNN thin film to be developed under such a policy, a leak current tends to reduce. However, although the KNN thin film functions when a low voltage (small potential difference) is applied, dielectric breakdown may occur when a high voltage (large potential difference) is applied.

A main reason why the dielectric breakdown occurs in the KNN thin film is considered to be concentration of electric charges on defects. When a stress of a potential difference (voltage) is applied to the KNN thin film having a small number of defects, the electric charges are likely to be concentrated in the defects in the KNN thin film. Therefore, even if a relatively low voltage is applied, a leak path is formed in the KNN thin film through the defects. Therefore, a range of voltage that can be applied to the piezoelectric element is limited, and a degree of freedom in designing and developing a device using the piezoelectric element is limited.

The piezoelectric layer 30 of the piezoelectric element 100 according to the present embodiment forms the pn junction at the boundary with the oxide layer 20 on the first electrode 10. The piezoelectric layer 30 according to the present embodiment originally has many carriers as a whole. Therefore, the electric charges are less likely to be concentrated on a specific defect. Accordingly, there is a large room for the electric charges to freely behave in the piezoelectric layer 30. Due to such a mechanism, it is considered that in the piezoelectric element according to the present embodiment, the concentration of the electric charges is likely to be reduced with respect to a stress when a voltage is applied.

In the piezoelectric element 100 according to the present embodiment, the pn junction is formed at the boundary between the piezoelectric layer 30 and the oxide layer 20 as described above. That is, the piezoelectric element 100 has electrical properties similar to a diode. A current flowing through the piezoelectric layer 30 in which a forward bias voltage (potential difference) is applied to the pn junction is larger than a current flowing through the piezoelectric layer 30 in which a reverse bias voltage (potential difference) is applied to the pn junction. Therefore, a leak current can be reduced by setting a current flowing through the piezoelectric layer 30 as a reverse bias with respect to the pn junction. Further, as described above, since the piezoelectric layer 30 of the piezoelectric element 100 according to the present embodiment has many carriers as a whole, even when the reverse bias voltage (potential difference) is applied to the pn junction, the dielectric breakdown is less likely to occur.

Therefore, in the piezoelectric element 100 according to the present embodiment, when a potential difference of 10 V is applied between the first electrode 10 and the second electrode 40, a current density of the leak current differs by 10,000 times or more between a case in which the first electrode 10 is set at a high potential and a case in which the second electrode 40 is set at a high potential. The difference in the current density of the leak current between the case in which the first electrode 10 is set at a high potential and the case in which the second electrode 40 is set at a high potential is more preferably 150,000 times or more, and still more preferably 200,000 times or more. When the difference in the current density is within the above-described range, the piezoelectric element 100 in which a current is applied to a specific polarity has a significant effect of reducing the leak current as compared with a piezoelectric element in which no pn junction is formed at a boundary between a piezoelectric layer and an oxide layer. On the other hand, the difference in the current density may be 50,000 times or more, or may be 10,000 times or more. Even when the difference in the current density is within the above-described range, the piezoelectric element 100 in which the current is applied to the specific polarity has a sufficient effect of reducing the leak current as compared with the piezoelectric element in which no pn junction is formed at the boundary between the piezoelectric layer and the oxide layer.

In the pn junction of the piezoelectric element 100 according to the present embodiment, the piezoelectric layer 30 is KNN and forms a p-type region. Then, the oxide layer 20 is made of a material forming an n-type region. Therefore, the piezoelectric element 100 is driven with a reverse bias in which a potential of the first electrode 10 is higher than a potential of the second electrode 40.

1.3. Modification of Piezoelectric Element

In a piezoelectric element according to the present embodiment, a piezoelectric layer containing potassium, sodium, and niobium may be disposed between a pair of electrodes, an oxide layer may be disposed between one electrode and the piezoelectric layer, and a pn junction may be formed at a boundary between the piezoelectric layer and the oxide layer. Further, when the piezoelectric element is driven, the piezoelectric element is driven by applying a reverse bias to the pn junction. Therefore, a substrate may be disposed at either electrode, and the above-described excellent effect can be exerted as long as a drive signal is applied according to the reverse bias.

For example, in the above piezoelectric element 100, the first electrode 10 is in contact with the base 2, and the first electrode 10 is disposed between the base 2 and the oxide layer 20. However, in the piezoelectric element, the second electrode 40 may be in contact with the base 2, and the second electrode 40 may be disposed between the base 2 and the piezoelectric layer 30.

Further, there may be two or more pn junctions formed between the pair of electrodes. For example, in the piezoelectric element, a piezoelectric layer containing potassium, sodium, and niobium may be disposed between a pair of electrodes, an oxide layer may be disposed between one electrode and the piezoelectric layer, an oxide layer may be disposed between the other electrode and the piezoelectric layer, and pn junctions may be formed at two boundaries between the piezoelectric layer and two oxide layers. In this case, when a drive signal is applied to at least one pn junction with a reverse bias, the same effect can also be exerted.

The piezoelectric element may have a configuration in which a plurality of the piezoelectric elements 100 are provided. Each piezoelectric element 100 is disposed between a common electrode and an individual electrode. The common electrode may be either the first electrode 10 of each piezoelectric element 100 or the second electrode 40 of each piezoelectric element 100. A reverse bias voltage is also applied to the pn junction of the piezoelectric element 100 when the piezoelectric element includes a common electrode.

When a potential of the common electrode of each piezoelectric element 100 is a reference potential, it is more preferable that a potential of the individual electrode is lower than the potential of the common electrode. In this way, when the plurality of piezoelectric elements 100 are arranged side by side, a drive signal transmitted to one of the piezoelectric elements 100 is less likely to be affected by a drive signal transmitted to another piezoelectric element 100, and a noise is reduced, and a further stable operation can be performed.

2. Method for Manufacturing Piezoelectric Element

Next, a method for manufacturing the piezoelectric element 100 according to the present embodiment will be described with reference to the drawings.

As shown in FIG. 1, the base 2 is prepared. Specifically, a silicon oxide layer is formed by thermally oxidizing a silicon substrate. Next, a zirconium layer is formed on the silicon oxide layer by a sputtering method or the like, and the zirconium layer is thermally oxidized to form a zirconium oxide layer. Accordingly, a vibrating plate including the silicon oxide layer and the zirconium oxide layer can be formed. Through the above steps, the base 2 can be prepared.

Next, the first electrode 10 is formed on the base 2. The first electrode 10 is formed by, for example, the sputtering method or a vacuum deposition method. Next, the first electrode 10 is patterned. The patterning is performed, for example, by photolithography and etching.

Next, the oxide layer 20 is formed on the first electrode 10. The oxide layer 20 is formed by, for example, the sputtering method or the vacuum deposition method. Next, the oxide layer 20 is patterned. The patterning is performed, for example, by photolithography and etching. The oxide layer 20 may be formed by a sol-gel method or a chemical solution deposition (CSD) method such as metal organic deposition (MOD). In addition, the oxide layer 20 may be patterned together with the first electrode 10 after the oxide layer 20 is formed before patterning the first electrode 10.

Next, the piezoelectric layer 30 is formed on the oxide layer 20. The piezoelectric layer 30 is formed by the sol-gel method or the chemical solution deposition (CSD) method such as the metal organic deposition (MOD). A method for forming the piezoelectric layer 30 will be described below.

First, for example, a metal complex containing potassium, a metal complex containing sodium, and a metal complex containing niobium are dissolved or dispersed in an organic solvent to prepare a precursor solution.

Examples of the metal complex containing potassium include potassium 2-ethylhexanoate and potassium acetate. Examples of the metal complex containing sodium include sodium 2-ethylhexanoate and sodium acetate. Examples of the metal complex containing niobium include niobium 2-ethylhexanoate, niobium ethoxide, niobium pentaethoxy, and niobium pentabutoxy. Two or more types of metal complexes may be used in combination. For example, potassium 2-ethylhexanoate and potassium acetate may be used in combination as the metal complex containing potassium.

Examples of the solvent include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, 2-n-ethylhexane, and a mixed solvent thereof.

Next, the prepared precursor solution is applied onto the oxide layer 20 by a spin coating method or the like to form a precursor layer. Next, the precursor layer is heated at, for example, 130° C. or higher and 250° C. or lower and dried for a certain period of time, and then the dried precursor layer is heated at, for example, 300° C. or higher and 450° C. or lower and held for a certain period of time, thereby degreasing the precursor layer. Next, the degreased precursor layer is crystallized by being fired at, for example, 550° C. or higher and 800° C. or lower to form a crystal layer.

Then, a series of steps from the application of the precursor solution to the firing of the precursor layer are repeated a plurality of times. Accordingly, the piezoelectric layer 30 including a plurality of crystal layers can be formed. Next, the piezoelectric layer 30 is patterned. The patterning is performed, for example, by photolithography and etching. The piezoelectric layer 30 including a single crystal layer may be formed without repeating a series of steps from the application of the precursor solution to the firing of the precursor layer a plurality of times.

A heating device used for drying and degreasing the precursor layer is, for example, a hot plate. A heating device used for firing the precursor layer is, for example, a rapid thermal annealing (RTA) device.

Next, the second electrode 40 is formed on the piezoelectric layer 30. The second electrode 40 is formed by, for example, the sputtering method or the vacuum deposition method. Next, the second electrode 40 is patterned. The patterning is performed, for example, by photolithography and etching.

Through the above steps, the piezoelectric element 100 can be manufactured.

The patterning of the second electrode 40 and the patterning of the piezoelectric layer 30 may be performed in the same step. In addition, when the piezoelectric layer 30 includes a plurality of crystal layers, a first crystal layer of the piezoelectric layer 30 and the first electrode 10 may be patterned in the same step. Further, when the piezoelectric layer 30 includes a plurality of crystal layers, the first crystal layer of the piezoelectric layer 30, the first electrode 10, and the oxide layer 20 may be patterned in the same step.

3. Liquid Ejection Head

Figure 2:
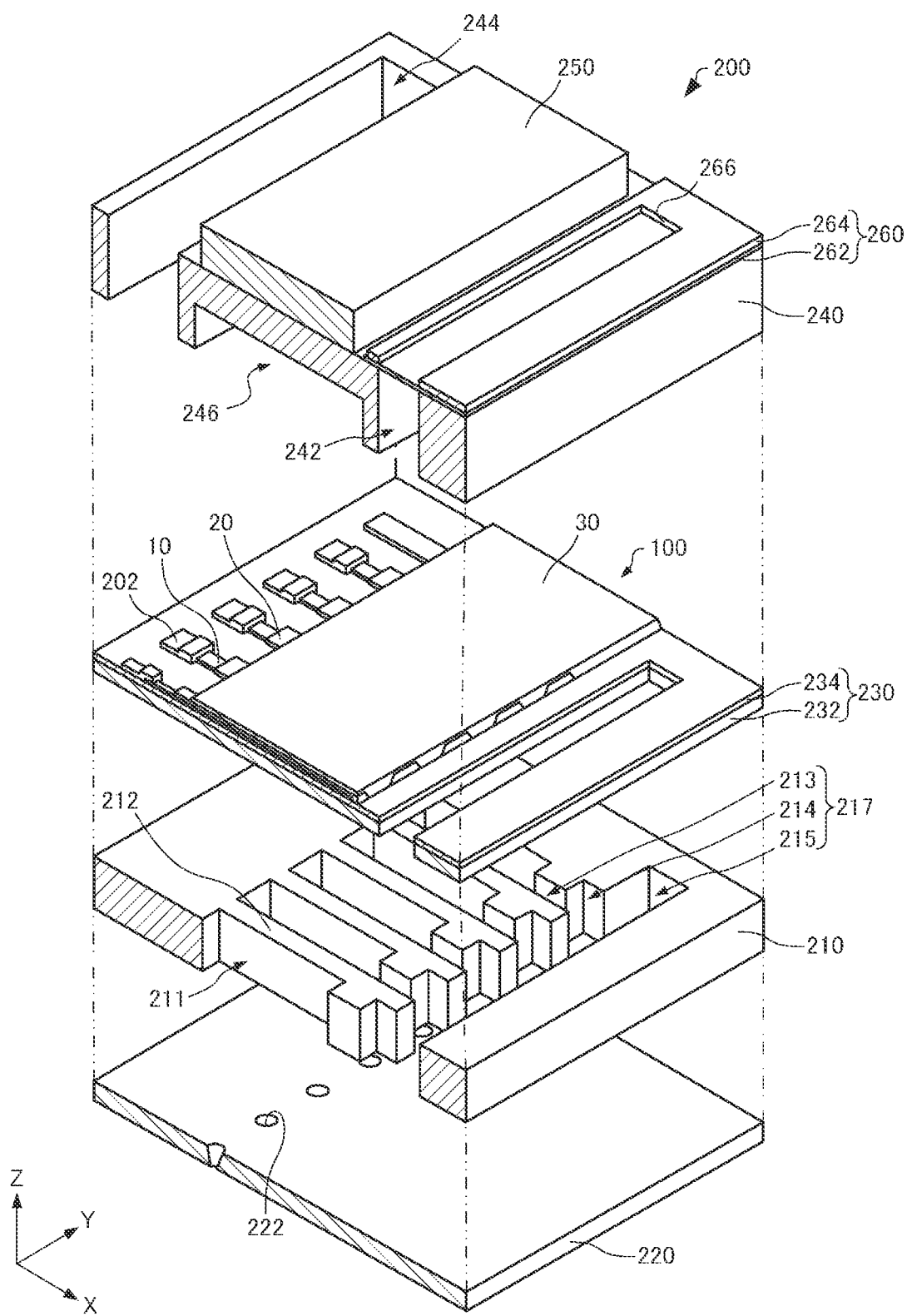
FIG. 2 is an exploded perspective view schematically showing a liquid ejection head according to the present embodiment.
Figure 3:
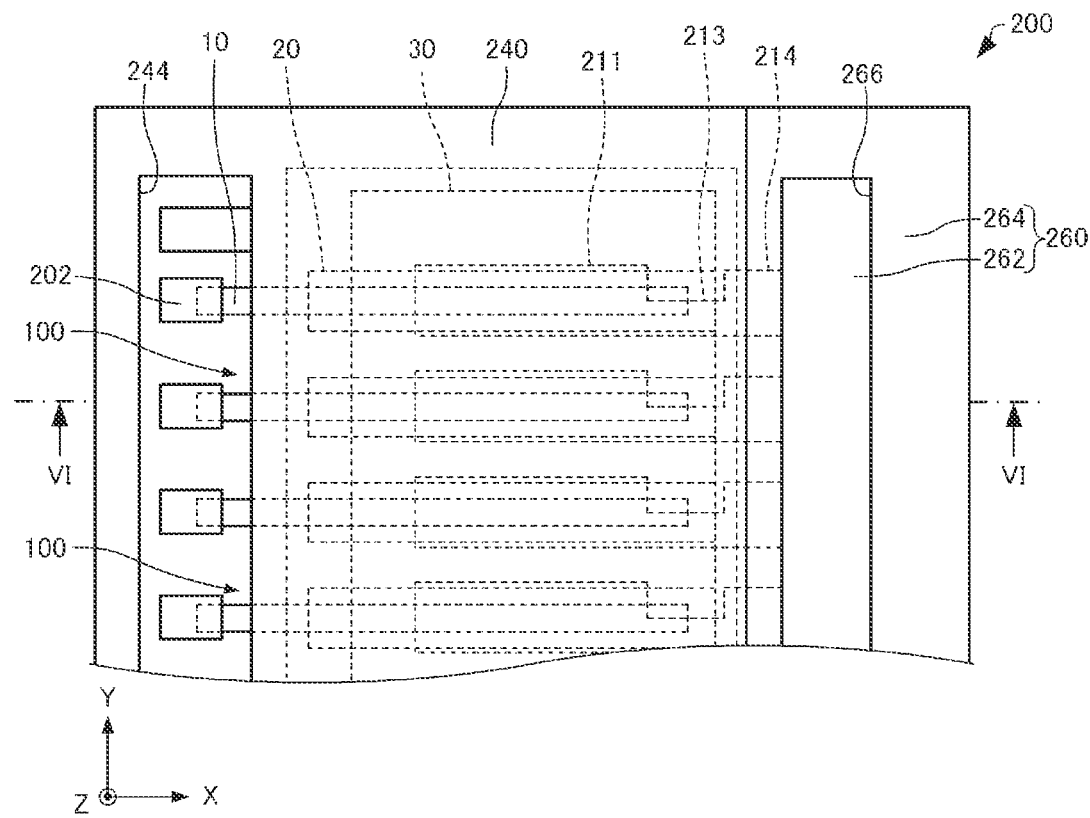
FIG. 3 is a plan view schematically showing the liquid ejection head according to the present embodiment.
Figure 4:
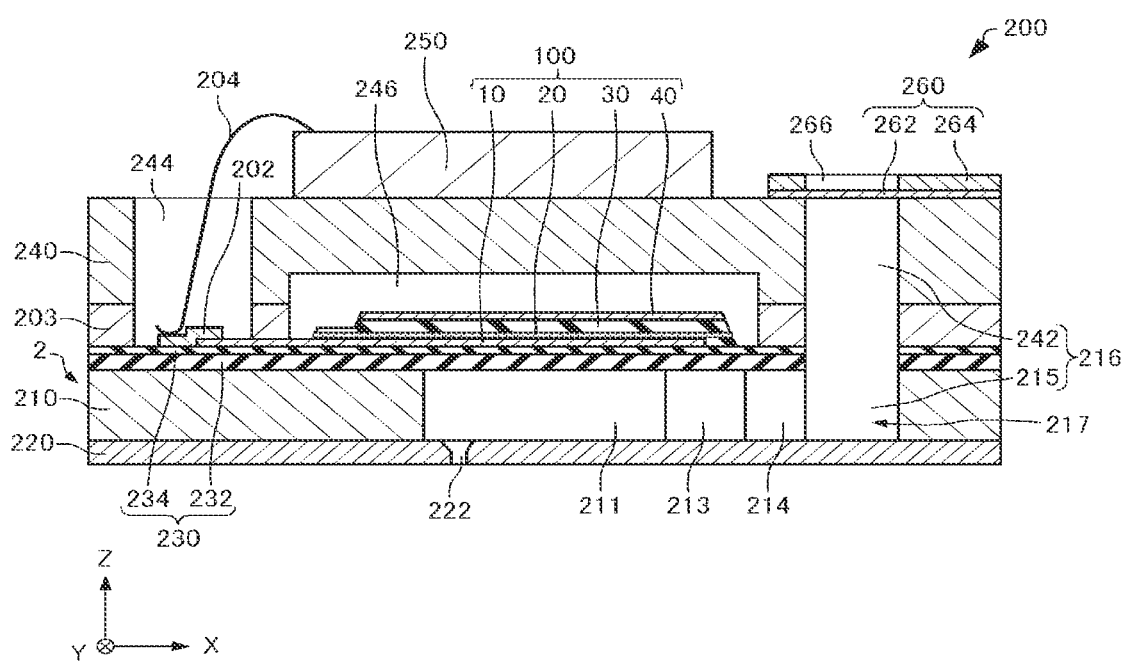
FIG. 4 is a cross-sectional view schematically showing the liquid ejection head according to the present embodiment.
Figure 5:
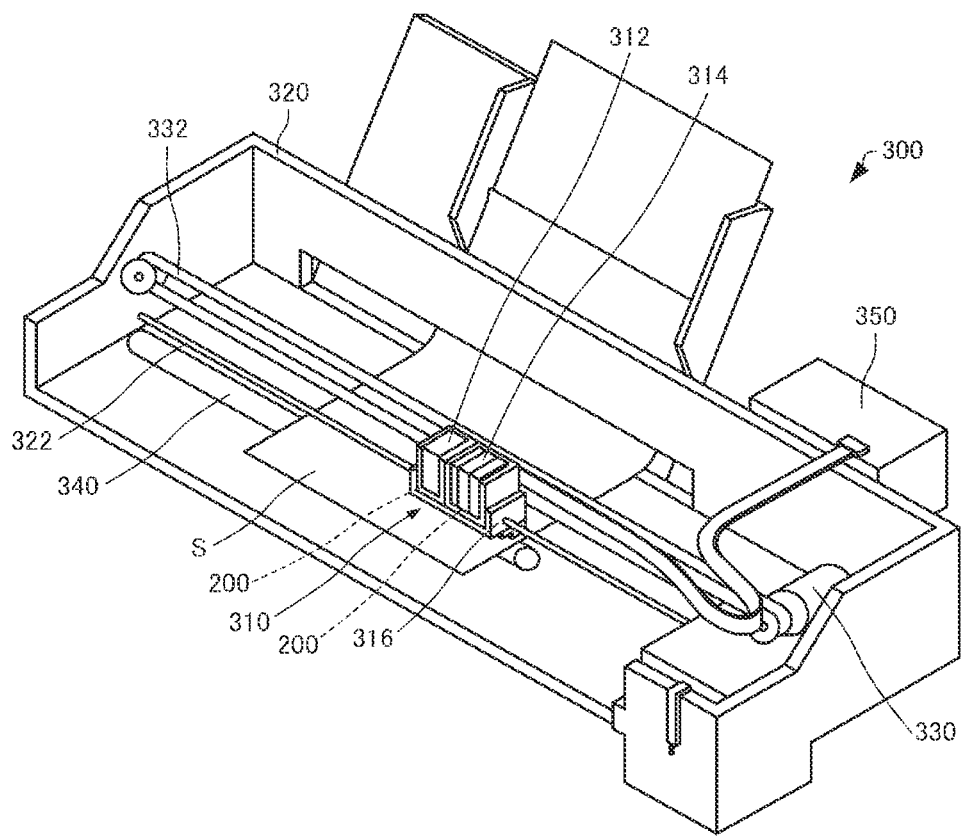
FIG. 5 is a perspective view schematically showing a printer according to the present embodiment.

Next, a liquid ejection head according to the present embodiment will be described with reference to the drawings. FIG. 2 is an exploded perspective view schematically showing a liquid ejection head 200 according to the present embodiment. FIG. 3 is a plan view schematically showing the liquid ejection head 200 according to the present embodiment. FIG. 4 is a cross-sectional view taken along a line VI-VI in FIG. 3 schematically showing the liquid ejection head 200 according to the present embodiment. FIGS. 2 to 4 each show an X axis, a Y axis, and a Z axis as three axes orthogonal to one another. In addition, FIGS. 2 to 4 show the piezoelectric element 100 in a simplified manner.

The liquid ejection head 200 includes, for example, the base 2, the piezoelectric element 100, a nozzle plate 220, a protective substrate 240, a circuit substrate 250, and a compliance substrate 260, as shown in FIGS. 2 to 4. The base 2 includes a flow path formation substrate 210 and a vibrating plate 230. For convenience, illustration of the circuit substrate 250 is omitted in FIG. 3.

The flow path formation substrate 210 is, for example, a silicon substrate. The flow path formation substrate 210 is provided with pressure generation chambers 211. The pressure generation chambers 211 are separated by a plurality of partition walls 212. A capacity of the pressure generation chamber 211 is changed by the piezoelectric element 100.

First communication paths 213 and second communication paths 214 are provided at an end of the flow path formation substrate 210 in a +X-axis direction of the pressure generation chamber 211. An opening area of the first communication path 213 is reduced by narrowing an end of the pressure generation chamber 211 in the +X-axis direction from a Y-axis direction. A width of the second communication path 214 in the Y-axis direction is, for example, the same as a width of the pressure generation chamber 211 in the Y-axis direction. A third communication path 215 that is in communication with the plurality of second communication paths 214 is provided in the +X-axis direction of the second communication path 214. The third communication path 215 constitutes a part of a manifold 216. The manifold 216 serves as a common liquid chamber for the pressure generation chambers 211. As described above, the flow path formation substrate 210 is provided with the pressure generation chambers 211 and a supply flow path 217 including the first communication paths 213, the second communication paths 214, and the third communication path 215. The supply flow path 217 is in communication with the pressure generation chambers 211 and a liquid is supplied to the pressure generation chambers 211 therethrough.

The nozzle plate 220 is provided on one surface of the flow path formation substrate 210. A material of the nozzle plate 220 is, for example, steel use stainless (SUS). The nozzle plate 220 is bonded to the flow path formation substrate 210 by, for example, an adhesive or a thermal welding film. The nozzle plate 220 is provided with a plurality of nozzle holes 222 along the Y axis. The nozzle holes 222 are in communication with the pressure generation chambers 211 and the liquid is ejected therethrough.

The vibrating plate 230 is provided on the other surface of the flow path formation substrate 210. The vibrating plate 230 includes, for example, a silicon oxide layer 232 provided on the flow path formation substrate 210 and a zirconium oxide layer 234 provided on the silicon oxide layer 232.

The piezoelectric element 100 is provided, for example, on the vibrating plate 230. A plurality of the piezoelectric elements 100 are provided. The number of piezoelectric elements 100 is not particularly limited.

In the liquid ejection head 200, the vibrating plate 230 and the first electrode 10 are displaced by deformation of the piezoelectric layer 30 having electromechanical conversion characteristics. That is, in the liquid ejection head 200, the vibrating plate 230 and the first electrode 10 substantially function as a vibrating plate.

The first electrode 10 is provided as an individual electrode that is independent for each of the pressure generation chambers 211. A width of the first electrode 10 in the Y-axis direction is smaller than the width of the pressure generation chamber 211 in the Y-axis direction. A length of the first electrode 10 in an X-axis direction is larger than a length of the pressure generation chamber 211 in the X-axis direction. In the X-axis direction, both ends of the first electrode 10 are located so as to sandwich both ends of the pressure generation chamber 211. A lead electrode 202 is coupled to an end of the first electrode 10 in a −X-axis direction.

The first electrode 10 is covered with the oxide layer 20. However, it is preferable that the end of the first electrode 10 on the −X-axis direction side is not covered with the oxide layer 20. Since no oxide layer 20 is provided between the lead electrode 202 and the first electrode 10, a decrease in conductivity can be prevented.

A width of the piezoelectric layer 30 in the Y-axis direction is, for example, larger than the width of the first electrode 10 in the Y-axis direction. A length of the piezoelectric layer 30 in the X-axis direction is, for example, larger than the length of the pressure generation chamber 211 in the X-axis direction. An end of the first electrode 10 in the +X-axis direction is located, for example, between an end of the piezoelectric layer 30 in the +X-axis direction and the end of the pressure generation chamber 211 in the +X-axis direction. The end of the first electrode 10 in the +X-axis direction is covered with the piezoelectric layer 30. On the other hand, an end of the piezoelectric layer 30 in the −X-axis direction is located, for example, between the end of the first electrode 10 on the −X-axis direction side and the end of the pressure generation chamber 211 in the −X-axis direction. The end of the first electrode 10 on the −X-axis direction side is not covered with the piezoelectric layer 30.

For example, the second electrode 40 is continuously provided on the piezoelectric layer 30 and the vibrating plate 230. The second electrode 40 is provided as a common electrode common to the plurality of piezoelectric elements 100.

The protective substrate 240 is bonded to the vibrating plate 230 by an adhesive 203. The protective substrate 240 is provided with a through hole 242. In the illustrated example, the through hole 242 penetrates the protective substrate 240 in a Z-axis direction and is in communication with the third communication path 215. The through hole 242 and the third communication path 215 constitute the manifold 216 that serves as the common liquid chamber for the pressure generation chambers 211. Further, the protective substrate 240 is provided with a through hole 244 that penetrates the protective substrate 240 in the Z-axis direction. Ends of the lead electrodes 202 are located in the through hole 244.

The protective substrate 240 is provided with an opening 246. The opening 246 is a space for not interfering with driving of the piezoelectric element 100. The opening 246 may or may not be sealed.

The circuit substrate 250 is provided on the protective substrate 240. The circuit substrate 250 includes a semiconductor integrated circuit (IC) for driving the piezoelectric element 100. The circuit substrate 250 and the lead electrodes 202 are electrically coupled to each other via coupling wirings 204.

The compliance substrate 260 is provided on the protective substrate 240. The compliance substrate 260 includes a sealing layer 262 provided on the protective substrate 240 and a fixed plate 264 provided on the sealing layer 262. The sealing layer 262 is a layer for sealing the manifold 216. The sealing layer 262 is, for example, flexible. The fixed plate 264 is provided with a through hole 266. The through hole 266 penetrates the fixed plate 264 in the Z-axis direction. The through hole 266 is provided at a position overlapping the manifold 216 when viewed from the Z-axis direction.

4. Printer

Figure 7:
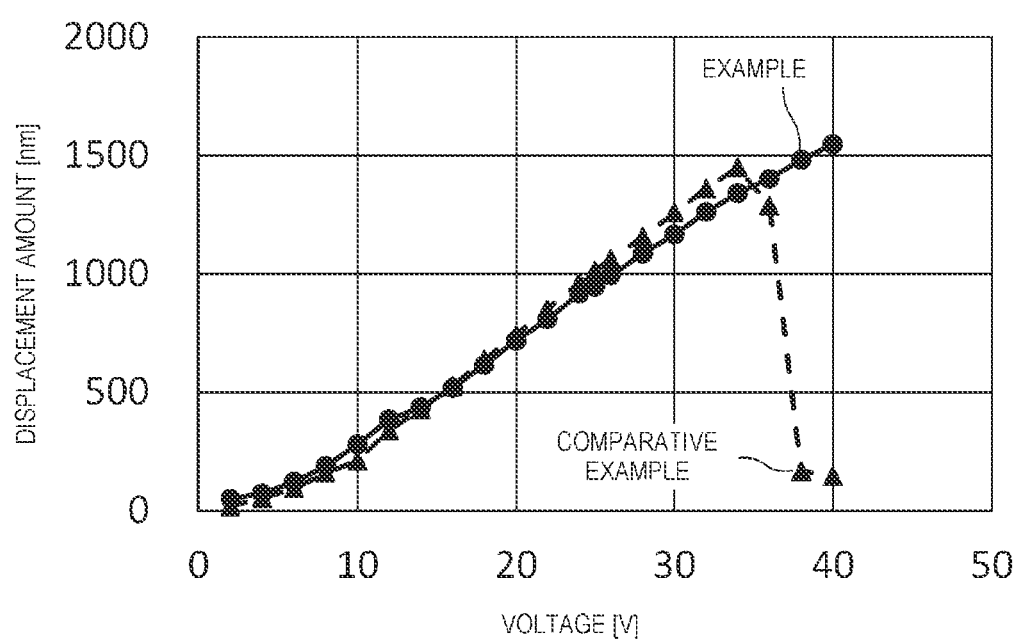
FIG. 7 shows displacement amount evaluation results according to Example and Comparative Example.

Next, a printer according to the present embodiment will be described with reference to the drawings. FIG. 7 is a perspective view schematically showing a printer 300 according to the present embodiment.

The printer 300 is an inkjet printer. The printer 300 includes a head unit 310 as shown in FIG. 7. The head unit 310 includes, for example, the liquid ejection heads 200. The number of liquid ejection heads 200 is not particularly limited. The head unit 310 is detachably provided with cartridges 312 and 314 that constitute a supply unit. A carriage 316 on which the head unit 310 is mounted is axially movable on a carriage shaft 322 attached to an apparatus main body 320, and ejects a liquid supplied from a liquid supply unit.

Here, the liquid may be any material which is a substance in a liquid phase, and a material in a liquid state such as a sol and a gel is also included in the liquid. In addition, the liquid includes not only a liquid as one state of a substance, but also those obtained by dissolving, dispersing, or mixing solid functional material particles such as pigments and metal particles in a solvent.

Typical examples of the liquid include an ink and a liquid crystal emulsifier. The ink includes various liquid compositions such as a general water-based ink, an oil-based ink, a gel ink, and a hot-melt ink.

In the printer 300, a driving force of a driving motor 330 is transmitted to the carriage 316 via a plurality of gears (not shown) and a timing belt 332, and thus the carriage 316 on which the head unit 310 is mounted is moved along the carriage shaft 322. On the other hand, the apparatus main body 320 is provided with a conveyance roller 340 as a conveyance mechanism that relatively moves a sheet S, which is a recording medium such as paper, with respect to the liquid ejection head 200. The conveyance mechanism that conveys the sheet S is not limited to the conveyance roller, and may be a belt, a drum, and the like.

The printer 300 includes a printer controller 350 as a control unit that controls the liquid ejection heads 200 and the conveyance roller 340. The printer controller 350 is electrically coupled to the circuit substrate 250 of the liquid ejection head 200. The printer controller 350 includes, for example, a random access memory (RAM) that temporarily stores various data, a read only memory (ROM) that stores a control program or the like, a central processing unit (CPU), and a drive signal generation circuit that generates a drive signal to be supplied to the liquid ejection head 200.

The piezoelectric element 100 can be used in a wide range of applications, without being limited to a liquid ejection head and a printer. The piezoelectric element 100 is suitably used as a piezoelectric actuator for, for example, an ultrasonic motor, a vibrating dust remover, a piezoelectric transformer, a piezoelectric speaker, a piezoelectric pump, and a pressure-electrical conversion device. In addition, the piezoelectric element 100 is suitably used as a piezoelectric sensor element of such as an ultrasonic detector, an angular velocity sensor, an acceleration sensor, a vibration sensor, an inclination sensor, a pressure sensor, a collision sensor, a motion sensor, an infrared sensor, a terahertz sensor, a heat detection sensor, a pyroelectric sensor, and a piezoelectric sensor. In addition, the piezoelectric element 100 is suitably used as a ferroelectric element of such as a ferroelectric memory (FeRAM), a ferroelectric transistor (FeFET), a ferroelectric arithmetic circuit (FeLogic), and a ferroelectric capacitor. Further, the piezoelectric element 100 is suitably used as a voltage-controlled optical element of such as a wavelength converter, an optical waveguide, an optical path modulator, a refractive index control element, and an electronic shutter mechanism.

5. Example and Comparative Example

The present disclosure will be described in more detail below with reference to Example, and the present disclosure is not limited to these examples.

5.1. Production of Thin Film Piezoelectric Element According to Example

First, a zirconium oxide film having a plane (100) on a surface thereof was formed by vapor deposition on a single crystal silicon substrate having a plane (100) on a surface thereof. Next, a platinum film having a plane (100) on a surface thereof was formed on the zirconium oxide film by a DC sputtering method.

Next, a SrRuO₃ film having a plane (100) on a surface thereof was formed on the platinum film by an RF sputtering method. Next, a piezoelectric layer was formed on the SrRuO₃ film by a liquid phase method (chemical solution method). A method for forming the piezoelectric layer will be described below.

First, a metal complex containing potassium, a metal complex containing sodium, and a metal complex containing niobium were dissolved or dispersed in an organic solvent to prepare a precursor solution. The prepared precursor solution was applied onto the SrRuO₃ film by a spin coating method to form a precursor layer (application step). Next, the precursor layer was heated at 180° C. and dried for a certain period of time (drying step), and then the dried precursor layer was heated at 395° C. and held for a certain period of time, thereby degreasing the precursor layer (degreasing step). Next, the degreased precursor layer was heated at 750° C. and held at 750° C. for 3 minutes, thereby crystallizing the degreased precursor layer (firing step).

Through the above steps, the piezoelectric layer was formed on the SrRuO₃ film. The piezoelectric layer having a thickness of 1.2 μm was formed by repeating a series of steps from the application step to the firing step 40 times.

Next, an upper electrode was formed on the piezoelectric layer. The upper electrode is formed by, for example, film formation using a sputtering method or a vacuum deposition method, and patterning using photolithography and etching.

5.2. Production of Thin Film Piezoelectric Element According to Comparative Example First, a SiO₂ film having a thickness of 1170 nm was formed by thermally oxidizing a surface of a single crystal silicon substrate having a plane (112) on the surface. Next, a Zr film having a thickness of 400 nm was formed by a DC sputtering method, and a ZrO₂ film was formed by heat treatment at 850° C. A Pt film having a thickness of 50 nm was formed on the ZrO₂ film by the DC sputtering method.

Next, a piezoelectric layer was formed by a liquid phase method in the same manner as in Example. A method for forming and patterning an upper electrode is the same as in Example.

5.3. Method for Evaluating Piezoelectric Element

The thin film piezoelectric elements according to Example and Comparative Example were evaluated as follows.

(1) Evaluation of Leak Current
  Device: 4140B (manufactured by Keisight)
  Conditions: 1 V to 40 V with a step of 1 V, 60 sec. delay/step
(2) Evaluation of Piezoelectric Characteristics
  Device: NLV-2500 (manufactured by Polytec), AFB3022C (manufactured by Textronix), HDO4024 (manufactured by Lecroy)
  Conditions: 50 Hz, sin wave, $V_{HIGH}$=2 V to 40 V, $V_{LOW}$=0 V (fixed)

5.4. Evaluation Results

Figure 6:
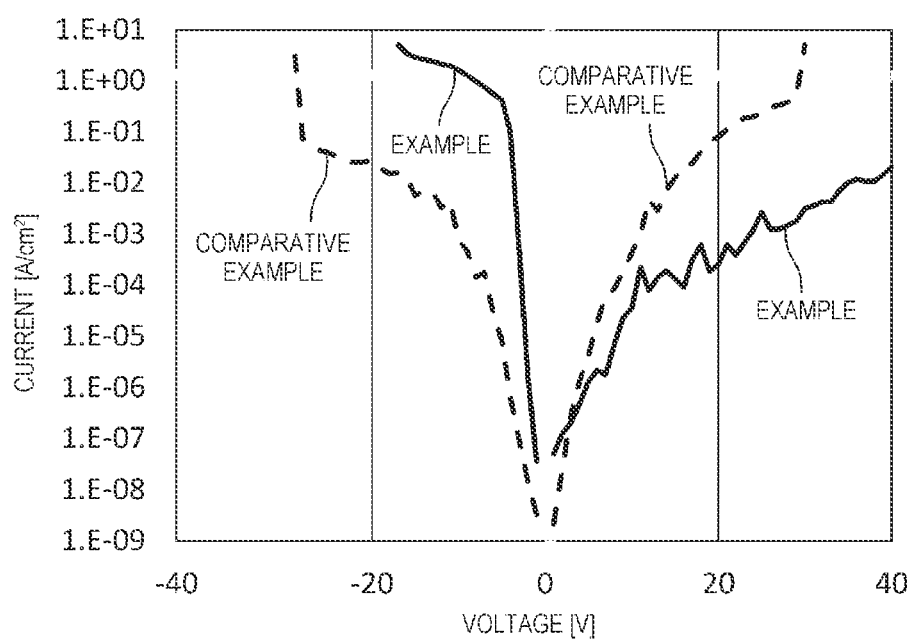
FIG. 6 shows leak current measurement results according to Example and Comparative Example.

FIG. 6 shows leak current measurement results of piezoelectric elements according to Example and Comparative Example. In Example, when a lower electrode (first electrode 10) was driven with a positive voltage, a leak current about five orders of magnitude smaller than that when an upper electrode (second electrode 40) was driven with a positive voltage is obtained, and dielectric breakdown did not occur when the positive voltage is increased up to 40 V. On the other hand, in Comparative Example, leak currents were almost the same regardless of a polarity of a voltage, and dielectric breakdown of a lower electrode and an upper electrode occurred at 30 V.

The leak current read from FIG. 6 was as follows.
When the lower electrode (first electrode 10) is driven with a positive voltage (+10 V),
  Example=$3\times10^{-5}$ A/cm²
  Comparative example=$4\times10^{-4}$ A/cm².
When the upper electrode (second electrode 40) is driven with a positive voltage (+10 V)
  Example=$2\times10^{0}$ A/cm²
  Comparative example=$8\times10^{-4}$ A/cm².

As is clear from the above-described results, it was found that in Example, as a result of forming a pn junction at a boundary between a KNN layer and a SRO layer, a leak current amount greatly differs between a forward bias and a reverse bias, and a leak current amount in the reverse bias is smaller than a leak current amount in Comparative Example.

FIG. 7 shows evaluation results of piezoelectric characteristics of the piezoelectric elements according to Example and Comparative Example. The KNN film of the piezoelectric element in Example exhibited good piezoelectric characteristics that breaking does not occur up to 40 V. On the other hand, in the piezoelectric element in Comparative Example, the dielectric breakdown occurred at 34 V, and the piezoelectric element did not function.

The above embodiments and modifications are examples, and the present disclosure is not limited thereto. For example, the embodiments and the modifications can also be appropriately combined.

The present disclosure includes a configuration substantially the same as the configuration described in the embodiment, for example, a configuration having the same function, method, and result, or a configuration having the same purpose and effect. In addition, the present disclosure includes a configuration obtained by replacing a non-essential portion of the configuration described in the embodiment. In addition, the present disclosure includes a configuration having the same function and effect as the configuration described in the embodiment, or a configuration capable of achieving the same purpose. Further, the present disclosure includes a configuration in which a known technique is added to the configuration described in the embodiment.

The following contents are derived from the above embodiments and modifications.

A piezoelectric element includes: a first electrode; an oxide layer formed on the first electrode; a piezoelectric layer formed on the oxide layer and containing potassium, sodium, and niobium; and a second electrode formed on the piezoelectric layer, and when a potential difference of 10 V is applied between the first electrode and the second electrode, a current density of a leak current differs by 10,000 times or more between a case in which the first electrode is set at a high potential and a case in which the second electrode is set at a high potential.

According to the piezoelectric element, as a result of forming a structure similar to a PN junction between the first electrode and the second electrode, a leak current can be reduced to be small with respect to a direction of a specific potential difference.

In the above piezoelectric element, the oxide layer may contain strontium and ruthenium.

According to the piezoelectric element, the leak current can be further reduced.

The above piezoelectric element may further include a base, and the first electrode may be disposed between the base and the oxide layer.

According to the piezoelectric element, a force can be applied to a substrate, and for example, the piezoelectric element can function as an actuator with a small leak current.

In the above piezoelectric element, the base may be a silicon substrate preferentially oriented in a plane (100).

According to the piezoelectric element, for example, a liquid ejection head with a small leak current and high efficiency can be provided.

According to the piezoelectric element, a plurality of the piezoelectric elements may be provided, one of the first electrode and the second electrode may be a common electrode, the other may be an individual electrode, and when the piezoelectric element is driven, a potential of the individual electrode may be lower than a potential of the common electrode when the potential of the common electrode is set as a reference.

According to the piezoelectric element, when the piezoelectric elements are adjacent to one another, a drive signal for one piezoelectric element is less likely to affect a drive signal for the other piezoelectric element, and thus a noise can be reduced and a further stable operation can be performed.

What is claimed is:

1. A piezoelectric element, comprising:
   a first electrode;
   a first oxide layer formed on the first electrode;
   a piezoelectric layer formed on the first oxide layer and containing potassium, sodium, and niobium; and
   a second electrode formed on the piezoelectric layer, wherein
   a pn junction is formed at a boundary between the first oxide layer and the piezoelectric layer,
   when a potential difference of 10 V is applied between the first electrode and the second electrode, a current density of a leak current differs by 10,000 times or more between a case in which the first electrode is set at a high potential and a case in which the second electrode is set at a high potential.

2. The piezoelectric element according to claim 1, wherein
   the first oxide layer contains strontium and ruthenium, and is preferentially oriented in a plane (100).

3. The piezoelectric element according to claim 1, further comprising:
   a base, wherein
   the first electrode is disposed between the base and the first oxide layer.

4. The piezoelectric element according to claim 3, wherein
   the base is a silicon substrate preferentially oriented in a plane (100).

5. The piezoelectric element according to claim 1, wherein
   a plurality of the piezoelectric elements are provided,
   one of the first electrode and the second electrode is a common electrode common to the plurality of the piezoelectric elements, and the other is an individual electrode, and
   when the piezoelectric element is driven, a potential of the individual electrode is lower than a potential of the common electrode when the potential of the common electrode is set as a reference.

6. A liquid ejection head, comprising:
   the piezoelectric element according to claim 1;
   a flow path formation substrate provided with a pressure generation chamber whose capacity is changed by the piezoelectric element; and
   a nozzle plate provided with a nozzle hole that is in communication with the pressure generation chamber.

7. The piezoelectric element according to claim 1, wherein
   the piezoelectric layer forms a p-type region, and the first oxide layer forms an n-type region.

8. The piezoelectric element according to claim 1, further comprising
   a second oxide layer formed between the piezoelectric layer and the second electrode, wherein
   a pn junction is formed at a boundary between the second oxide layer and the piezoelectric layer.

* * * * *